United States Patent
Farooq et al.

(10) Patent No.: US 6,854,636 B2
(45) Date of Patent: Feb. 15, 2005

(54) STRUCTURE AND METHOD FOR LEAD FREE SOLDER ELECTRONIC PACKAGE INTERCONNECTIONS

(75) Inventors: Mukta G. Farooq, Hopewell Junction, NY (US); Mario Interrante, New Paltz, NY (US); William Sablinski, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 84 days.

(21) Appl. No.: 10/314,498

(22) Filed: Dec. 6, 2002

(65) Prior Publication Data

US 2004/0108367 A1 Jun. 10, 2004

(51) Int. Cl.$^7$ .................................................. B23K 31/00
(52) U.S. Cl. ................................. 228/180.22; 228/246
(58) Field of Search .......................... 228/179.1, 180.1, 228/180.21, 180.22, 245–262; 257/737, 738; 438/613, 614, 615

(56) References Cited

U.S. PATENT DOCUMENTS

| | | | |
|---|---|---|---|
| 4,778,733 A | | 10/1988 | Lubrano et al. |
| 5,011,658 A | | 4/1991 | Niedrich |
| 5,147,084 A | | 9/1992 | Behun et al. |
| 5,672,542 A | | 9/1997 | Schwiebert et al. |
| 5,729,440 A | | 3/1998 | Jimarez et al. |
| 5,863,493 A | | 1/1999 | Achari et al. |
| 5,937,320 A | * | 8/1999 | Andricacos et al. ......... 438/614 |
| 6,015,505 A | * | 1/2000 | David et al. ................ 252/79.2 |
| 6,130,170 A | * | 10/2000 | David et al. ................ 438/745 |
| 6,158,644 A | | 12/2000 | Brofman et al. |
| 6,204,558 B1 | * | 3/2001 | Yanagida ..................... 257/737 |
| 6,297,559 B1 | * | 10/2001 | Call et al. .................... 257/778 |
| 6,333,563 B1 | | 12/2001 | Jackson et al. |
| 6,416,883 B1 | * | 7/2002 | Walton ........................ 428/647 |
| 6,429,388 B1 | | 8/2002 | Interrante et al. |
| 6,436,703 B1 | | 8/2002 | Tang et al. |
| 6,436,730 B1 | | 8/2002 | Melton et al. |
| 6,464,122 B1 | | 10/2002 | Tadauchi et al. |
| 6,468,413 B1 | * | 10/2002 | Fanti et al. .................. 205/682 |
| 6,495,397 B2 | * | 12/2002 | Kubota et al. ............... 438/108 |
| 6,515,372 B1 | * | 2/2003 | Narizuka et al. ............ 257/779 |
| 6,518,089 B2 | | 2/2003 | Coyle |
| 6,541,305 B2 | | 4/2003 | Farooq et al. |
| 6,574,859 B2 | | 6/2003 | Farooq et al. |
| 6,581,821 B2 | | 6/2003 | Sarkhel |
| 6,595,404 B2 | * | 7/2003 | Suzuki et al. ............... 228/175 |
| 6,622,907 B2 | * | 9/2003 | Fanti et al. .................. 228/215 |
| 6,638,847 B1 | | 10/2003 | Cheung et al. |
| 6,661,093 B2 | * | 12/2003 | Ujiie et al. .................. 257/738 |
| 2001/0018230 A1 | | 8/2001 | Jimarez et al. |

(List continued on next page.)

FOREIGN PATENT DOCUMENTS

| | | |
|---|---|---|
| JP | 5-136216 | 6/1993 |
| JP | 2000-301376 | 10/2000 |
| JP | 2001-35978 | 2/2001 |
| JP | 2002-124533 | 4/2002 |
| WO | WO 02/063674 | 8/2002 |

Primary Examiner—Kiley Stoner
(74) Attorney, Agent, or Firm—James J. Cioffi

(57) ABSTRACT

An electronic package having a solder interconnect liquidus temperature hierarchy to limit the extent of the melting of the C4 solder interconnect during subsequent second level join/assembly and rework operations. The solder hierarchy employs the use of off-eutectic solder alloys of Sn/Ag and Sn/Cu with a higher liquidus temperature for the C4 first level solder interconnections, and a lower liquidus temperature alloy for the second level interconnections. When the second level chip carrier to PCB join/assembly operations occur, the chip to chip carrier C4 interconnections do not melt completely. They continue to have a certain fraction of solids, and a lower fraction of liquids, than a fully molten alloy. This provides reduced expansion of the solder join and consequently lower stresses on the C4 interconnect.

14 Claims, 3 Drawing Sheets

U.S. PATENT DOCUMENTS

| | | |
|---|---|---|
| 2001/0026957 A1 | 10/2001 | Atwood et al. |
| 2002/0064678 A1 | 5/2002 | Kiyotoki et al. |
| 2002/0074656 A1 * | 6/2002 | Ujiie et al. .................. 257/738 |
| 2002/0192443 A1 | 12/2002 | Sarkhel |
| 2002/0192935 A1 | 12/2002 | Joshi et al. |
| 2003/0104183 A1 * | 6/2003 | Narizuka et al. ........... 428/209 |
| 2003/0155408 A1 * | 8/2003 | Fanti et al. .................. 228/215 |
| 2003/0230806 A1 | 12/2003 | Yamashita et al. |
| 2004/0035909 A1 * | 2/2004 | Yeh et al. ................... 228/56.3 |
| 2004/0080024 A1 * | 4/2004 | Datta ......................... 257/627 |
| 2004/0108367 A1 * | 6/2004 | Farooq et al. .............. 228/245 |

* cited by examiner

US 6,854,636 B2

STRUCTURE AND METHOD FOR LEAD FREE SOLDER ELECTRONIC PACKAGE INTERCONNECTIONS

RELATED APPLICATIONS

This application is related to subject matter described and claimed in U.S. patent application Ser. No. 10/246,282 entitled "Solder Hierarchy For Lead Free Solder Joint" by the inventors of the instant application.

BACKGROUND OF THE INVENTION

The present invention relates to a lead free solder structure for the assembly of electronic components, and more particularly, to a lead free solder hierarchy for use in the assembly of electronic components.

Current controlled collapse chip connection (C4) or "flip chip" interconnection technology for joining chips to either ceramic or organic substrates typically employ a 97/3 Pb/Sn joining solder alloy as the ball-limiting metallurgy (BLM) on the chip side of the interconnect, and a suitable metallization, typically Ni/Au or Cr/Cu/Ni/Au, on the substrate side of the interconnect. This interconnect structure has to withstand temperature cycling. This temperature cycling can be a very stringent requirement, especially for chip on board interconnects where the chip is attached directly to a printed circuit board (PCB).

This is because the thermal coefficient of expansion (TCE) of the chip is around 3 parts per million (ppm), and that of a typical PCB is 15–18 ppm. For a ceramic substrate chip carrier, the TCE is much better matched, because the ceramic TCE lies in the range of 3.5 to 6.6 ppm. An underfill material, typically an epoxy, is often used to create a more reliable structure, particularly for chip-on-board schemes, where the strain caused by the high TCE mismatch is accommodated without causing fails.

A current problem now facing the industry is that lead elimination is a strategic requirement for all manufacturers. A lead free solution for chip attachment is actively being sought. One possible solution is to use a Sn rich alloy such as Sn/Ag/Cu or Sn/Ag/Bi, where the Sn comprises about 96% of the alloy. Such an alloy requires the use of a lower temperature for joining, in the range of 245 to 255° C. This is in contrast to temperatures as high as 340° C. for the Pb/Sn solder alloy.

An additional problem is that in manufacturing, joining the chip to a first level package, typically a ceramic or organic chip carrier, is the first step. This is followed by encapsulation with an underfill material and hat/lid attachment to form a module. After this first level interconnect assembly is complete, the module proceeds to the second level join. Second level join is the interconnect of the chip carrier to a PCB. This interconnect may be, for example, a ceramic ball grid array (CBGA), ceramic column grid array (CCGA), or plastic ball grid array (PBGA). In the Pb/Sn system, all this can be achieved easily, because the first level chip join to chip carrier step uses a 97/3 Pb/Sn solder alloy and requires a very high temperature, approximately 340° C. The second level chip carrier to PCB join step uses lower Pb compositions, such as eutectic Pb/Sn, and requires a much lower reflow temperature in the range of 200–220° C.

Therefore in the Pb system the chip C4 solder connection remains mostly undisturbed and in the solid state during subsequent processing. Using a Pb free, Sn rich alloy for both first level chip join and second level module to board join creates the problem of the chip BLM becoming molten during the second level attach processes and subsequent reflows such as may be required for rework.

Another problem is that when the first level SnAgCu solder interconnect becomes completely molten inside the underfill encapsulant, it produces large hydrostatic stresses on the walls of the encapsulant. These forces create strains large enough to cause delamination, cracking, rupture and finally, catastrophic fail of the encapsulant regions. This would likely cause shorting between the C4 solder connections, and potentially cause opens where the C4 solder connections may break away from their original as-joined position.

Whereas other alloy systems such as AuSn 80/20 may be employed to produce a solder temperature hierarchy, such solutions may not be widely applicable because of various manufacturing problems. Examples include the cost of the materials, brittle metallurgical properties and solder interactions which cause stress on the chip.

Therefore, notwithstanding the prior art solutions to the problem, there remains a need for a solder structure hierarchy which employs the use of alloys with a higher liquidus temperature for the first level C4 interconnections, and the use of alloys with a lower liquidus temperature for second level interconnections.

Accordingly, it is a purpose of the present invention to provide a lead free solder hierarchy structure for electronic packaging.

These and other purposes of the present invention will become more apparent after referring to the following description considered in conjunction with the accompanying drawings.

BRIEF SUMMARY OF THE INVENTION

The purposes and advantages of the present invention have been achieved by providing a lead free solder hierarchy structure for electronic package interconnections comprising an electronic circuit chip attached to a top side of a chip carrier with a first lead free off-eutectic solder composition, an array of lead free solder connections, such as solder columns or solder balls, attached to a bottom side of said chip carrier with a second lead free off-eutectic solder composition, the second lead free off-eutectic solder composition having a lower liquidus temperature than the first lead free off-eutectic solder composition; and a printed circuit board having a top side attached to the array of lead free solder connections by a third lead free solder composition, the third lead free solder composition having a lower liquidus temperature than the second off-eutectic lead free solder composition thereby creating a lead free hierarchy for electronic packaging interconnections.

The first chip interconnect lead free off-eutectic solder composition is an alloy consisting essentially of between 52.0–95.0 weight % Sn, between 48.0–5.0 weight % Ag, and having inter-metallics with a melting temperature greater than 250° C. and having dispersed grains of SnAg inter-metallic phase structure. Preferred compositions include 72.0% Sn and 28.0% Ag; 82.0% Sn and 18.0% Ag; 88.0% Sn and 12.0% Ag, and 52.0% Sn and 48.0% Ag.

Alternatively, the first chip interconnect lead free off-eutectic solder composition may be an alloy consisting essentially of between 84.0–99.3% Sn, between 16.0–0.7% Cu; and having inter-metallics with a melting temperature greater than 250° C. and having dispersed grains of SnCu inter-metallic phase structure. Preferred compositions include 84.0% Sn and 16.0% Cu; and 93.0% Sn and 7.0% Cu;

The present invention also provides a method for creating a lead free solder melting hierarchy for first level assembly comprising the steps of:

provoding an electronic circuit chip having ball limiting metallurgy pads on a bottom surface of the chip;

placing off-eutectic lead free solder on the ball limiting metallurgy pads;

heating the off-eutectic lead free solder to reflow the off-eutectic lead free solder and form off-eutectic lead free solder bumps on the ball limiting metallurgy pads;

providing a chip carrier having electrical contact pads on a top surface of the chip carrier;

placing a lead free solder alloy in contact with the contact pads;

placing said off-eutectic lead free solder bumps in contact with the lead free solder alloy; and heating the off-eutectic lead free solder bumps to reflow the off-eutectic lead free solder bumps to form off-eutectic lead free solder fillets which adhere the chip to the chip carrier.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
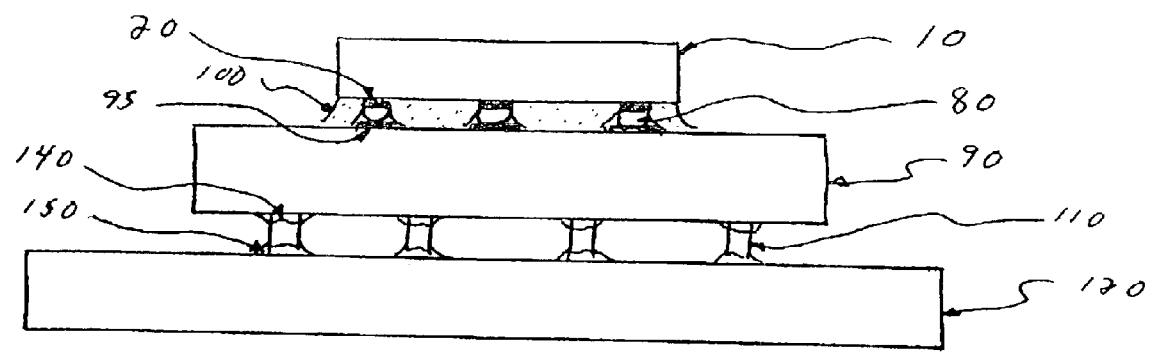
FIG. 1 is a schematic view of the lead free solder hierarchy structure for electronic package interconnections of the present invention.

The present invention provides a solder liquidus temperature hierarchy to limit the extent of the melting of the C4 solder interconnect between the chip and chip carrier during subsequent second level join/assembly and rework operations. The term "liquidus temperature" is defined as that temperature above which the solder alloy is in a completely liquid phase.

It is desirable to stay within the same alloy system that is used for other Pb-free joining operations in the module/package. The Sn—Ag—Cu, Sn—Cu or Sn—Ag systems are the most prevalent and preferred alloy systems for Pb-free interconnections and are recommended by the National Electronics Manufacturing Initiative (NEMI).

The present invention employs the use of alloys, some combination of two or more of Sn, Ag, Cu, with a higher liquidus temperature for the C4 first level solder interconnections, and a lower liquidus temperature alloy for the second level interconnections. According to the present invention, when the second level chip carrier to PCB join/assembly operations occur, the chip to chip carrier C4 interconnections are not able to melt completely. They continue to have a certain fraction of solids, and a lower fraction of liquids, than a fully molten alloy. Therefore the expansion is curtailed so as to produce lower stresses on the encapsulant or underfill. Depending on the maximum temperature allowed for a homogenization reflow, and the method of deposition (plating, screening, evaporation or other), alloys homogenizing with different liquidus temperatures may be employed.

In a first embodiment of the present invention a Sn/Ag off-eutectic lead free solder composition is provided having between about 52.0–95.0 weight % Sn and between about 48.0–5.0 weight % Ag and having inter-metallics with a melting temperature greater than 250° C. The term "inter-metallic" has its ordinary meaning of a compound with two or more metals.

In a preferred embodiment of the present invention a 72Sn/28Ag (weight %) solder alloy is used which has a liquidus temperature of approximately 400° C. A chip join C4 reflow cycle with a peak temperature of approximately 355–375° C., with adequate dwell time typically about 1–4 minutes, will suffice to create a homogenous lead free C4 solder alloy interconnection. A homogenized solder alloy interconnection has a uniformly distributed inter-metallic phase structure.

During the subsequent second level join/assembly process, the maximum peak temperature is approximately 250° C. This temperature will create a pasty two-phase inter-metallic structure in the C4 solder alloy interconnect, comprised of approximately 68 weight % liquid phase, and approximately 32 weight % solid phase. This alloy structure will restrict the expansion of the C4 interconnections and ensure the integrity of the surrounding encapsulant.

In another preferred embodiment of the present invention a 82Sn/18Ag (in weight %) solder alloy is used which has a liquidus temperature of approximately 355° C. A chip join C4 reflow cycle with a peak temperature of approximately 355–375° C., with adequate dwell time typically about 1–4 minutes, will completely melt the C4 solder alloy interconnect. Then during the subsequent second level join/assembly process, the maximum peak temperature is approximately 250° C. This temperature will create a pasty two-phase inter-metallic structure in the C4 solder alloy interconnect, comprised of approximately 82 weight % liquid phase, and approximately 18 weight % solid phase. This alloy structure will restrict the expansion of the C4 interconnections and ensure the integrity of the surrounding encapsulant.

In another preferred embodiment of the present invention a 88Sn/12Ag (in weight %) solder alloy is used which has a liquidus temperature of approximately 310° C. A chip join C4 reflow cycle with a peak temperature of approximately 355–375° C., with adequate dwell time typically about 1–4 minutes, will completely melt the C4 solder alloy interconnect. Then during the subsequent second level join/assembly process, the maximum peak temperature is approximately 250° C. This temperature will create a pasty two-phase inter-metallic structure in the C4 solder alloy interconnect, comprised of approximately 91 weight % liquid phase, and approximately 9 weight % solid phase. This alloy structure will restrict the expansion of the C4 interconnections and ensure the integrity of the surrounding encapsulant.

In another preferred embodiment of the present invention a 52Sn/48Ag (in weight %) solder alloy is used which has a liquidus temperature of approximately 480° C. A chip join C4 reflow cycle with a peak temperature of approximately 355–375° C., with adequate dwell time typically about 1–4 minutes, will suffice to create a homogenized C4 solder alloy interconnection. Then during the subsequent second level join/assembly process, the maximum peak temperature is approximately 250° C. This temperature will create a pasty two-phase inter-metallic structure in the C4 solder alloy interconnect, comprised of approximately 38 weight % liquid phase, and approximately 62 weight % solid phase. This alloy structure will restrict the expansion of the C4 interconnections and ensure the integrity of the surrounding encapsulant.

In a second embodiment of the present invention a Sn/Cu off-eutectic lead free solder composition of between about 84.0–99.3 weight % Sn and between about 16.0–0.7 weight % Cu and having inter-metallics with a melting temperature greater than 250° C.

In a preferred embodiment of the present invention a 84Sn/16Cu (in weight %) solder alloy is used which has a liquidus temperature of approximately 500° C. A chip C4 reflow cycle with a peak temperature of approximately 350–375° C., with adequate dwell time typically about 1–4 minutes, will suffice to create a homogenized C4 solder alloy interconnection. Then during the subsequent second level join/assembly process, the maximum peak temperature is approximately 250° C. This temperature will create a pasty two-phase inter-metallic structure in the C4 solder alloy interconnect, comprised of approximately 72 weight % liquid phase, and approximately 28 weight % solid phase. This alloy structure will restrict the expansion of the C4 interconnections and ensure the integrity of the surrounding encapsulant.

In another preferred embodiment of the present invention a 93Sn/7Cu (in weight %) solder alloy is used which has a liquidus temperature of approximately 410° C. A chip C4 reflow cycle with a peak temperature of approximately 350–375° C., with adequate dwell time typically about 1–4 minutes, will suffice to create a homogenized C4 solder alloy interconnection. Then during the subsequent second level join/assembly process, the maximum peak temperature is approximately 250° C. This temperature will create a pasty two-phase inter-metallic structure in the C4 solder alloy interconnect, comprised of approximately 86 weight % liquid phase, and approximately 14 weight % solid phase. This alloy structure will restrict the expansion of the C4 interconnections and ensure the integrity of the surrounding encapsulant.

The present invention allows the creation of a lead free solder hierarchy structure for electronic package interconnections. Referring to FIG. 1 an electronic circuit chip 10 having BLM pads 20 on a bottom surface is attached to a top side of a chip carrier 90 having contact pads 95. The chip 10 is joined to the chip carrier 90 with the lead free off-eutectic solder composition of the present invention 80. An array of lead free solder connections, such as solder columns 110 or solder balls (not shown) are then used to join the chip carrier 90 to a PCB 120.

The lead free solder connections 110 are attached to the bottom side of the chip carrier 90 with a second lead free off-eutectic solder composition 140 which has a lower liquidus temperature than the first lead free off-eutectic solder composition 80. The chip carrier 90 is then joined to a PCB 120 by a third lead free solder composition 150 which has a lower liquidus temperature than the second off-eutectic lead free solder composition 140 thereby creating a lead free solder hierarchy for electronic packaging interconnections.

In a preferred embodiment of the lead free solder hierarchy the first lead free off-eutectic solder composition 80 is about 72.0 weight % Sn and 28.0 weight % Ag, and has dispersed grains of SnAg inter-metallic phase structure and a liquidus temperature of approximately 400° C. The second lead free off-eutectic solder composition 140 is about 82.0 weight % Sn and 18 weight % Ag, and has dispersed grains of SnAg inter-metallic phase structure and a liquidus temperature of approximately 355° C. The third lead free solder composition 150 is about 95.5 weight % Sn and 3.8 weight % Ag and 0.7 weight % Cu and has a liquidus temperature of approximately 217° C.

Figure 2:
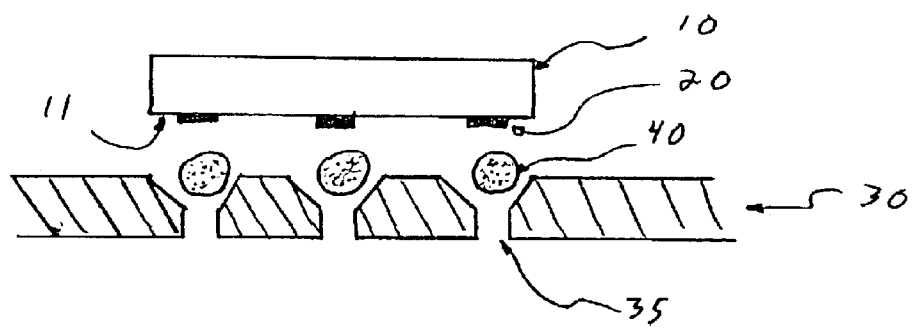
FIG. 2 is a schematic view of a chip/boat assembly.

A preferred method is illustrated with reference to FIG. 2. There is shown an electronic circuit chip 10 having BLM pads 20 on a bottom surface 11 of the chip 10. A preform boat 30, typically made of graphite, contains openings 35 which are arrayed to coincide with the position of the BLM pads 20 on the chip 10. The off-eutectic solder preforms 40 of the present invention are then placed in the boat openings 35. The chip 10 is then positioned on the boat 30 such that the BLM pads 20 are in contact with the off-eutectic solder preforms 40.

Figure 3:
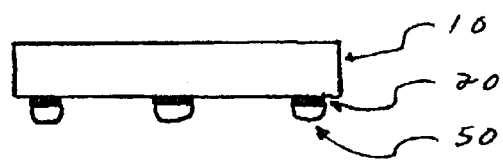
FIG. 3 is a schematic view of a chip with lead free solder bumps according to the present invention.

The resulting chip/boat assembly is then heated to the required reflow temperature, typically between 350° C. and 375° C., whereby the solder preforms 40 are reflowed onto the BLM pads 20. The chip/boat assembly is then cooled resulting in the chip BLM pads 20 being coated with off-eutectic lead free solder bumps 50 as is illustrated in FIG. 3.

Figure 4:
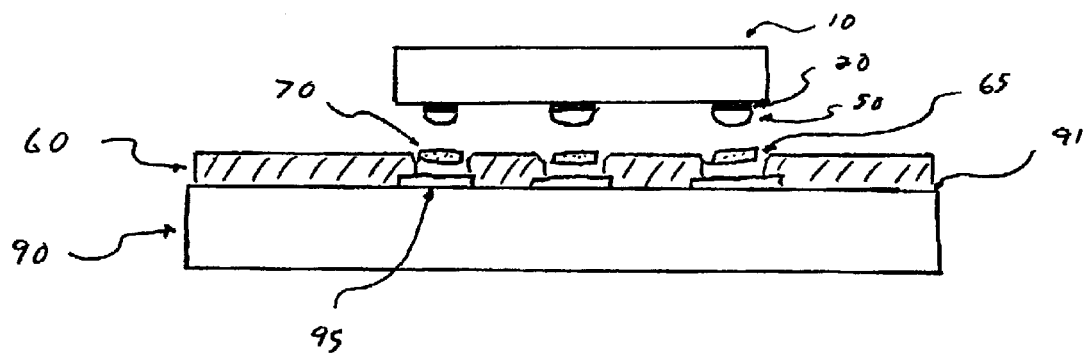
FIG. 4 is a schematic view of a chip/boat/chip carrier assembly.

Referring now to FIG. 4 there is shown a second boat 60 containing second openings 65 which are arrayed to coincide with the position of the solder bumps 50 on the chip 10. A chip carrier 90 is provided having contact pads 95 on a top surface 91 of the chip carrier 90 such that the second openings 65 coincide with the contact pads 95. A lead free solder alloy or fluxing agent 70 is placed in the second openings 65 and in contact with the pads 95. The chip 10 is then positioned on the opposite side of the second boat 60 such that the off-eutectic solder bumps 50 are in contact with the solder alloy or fluxing agent 70.

The resulting chip/chip carrier assembly is heated to a second desired reflow temperature whereby the off-eutectic solder bumps 50 are reflowed on the flux coated or lead free alloy coated contact pads. The chip/chip carrier assembly is then cooled wherein the reflowed off-eutectic solder bumps form off-eutectic solder fillets 80 which adhere the chip 10 to the chip carrier as shown in FIG. 1.

Referring again to FIG. 1 the finished module is shown. Prior to joining the chip carrier 90 to a printed circuit board (PCB) 120 an encapsulant 100 is dispensed under the chip 10. This encapsulant 100, also commonly referred to as an "underfill", is typically an epoxy based material. It is used to improve the reliability of the solder joint by absorbing some of the strain caused by the TCE.

Figure 5:
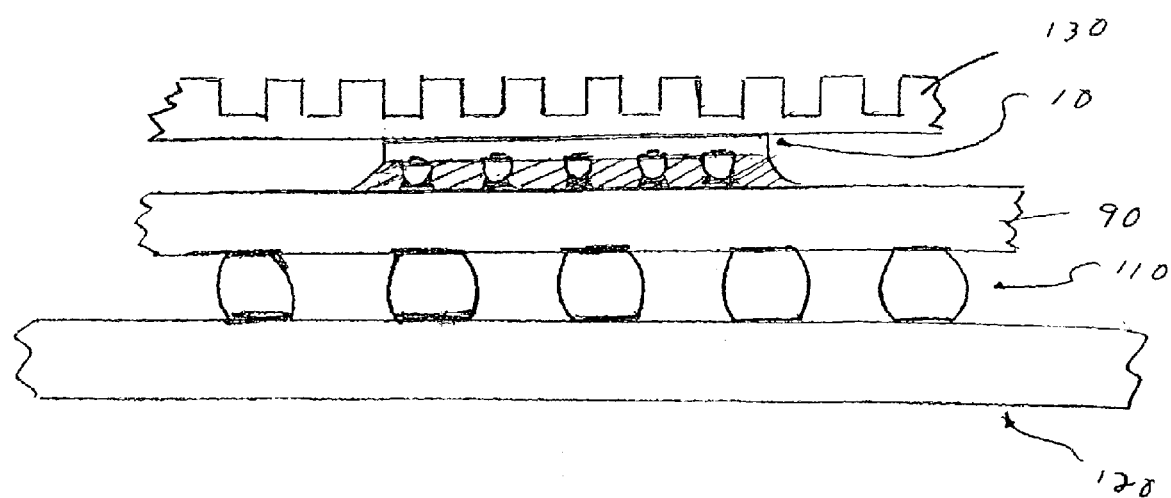
FIG. 5 is a schematic view of a module with heat sink.

The chip carrier 90 is then joined to the PCB 120 with a solder connection 150. In FIG. 1 the solder connection is shown as a column grid array. As shown in FIG. 5 the module may also have a heat sink 130 attached either directly to the chip 10 as shown, or to a lid (not shown) positioned over the chip and attached to the chip carrier.

Referring again to FIG. 1 the solder hierarchy achieved by the present invention is shown. The off-eutectic solder of the present invention 80 will have a higher reflow temperature than the BSM fillet 140. Similarly, the BSM fillet will have a higher reflow temperature than the PCB fillet 150. The BSM fillet 140 corresponds to the off-eutectic lead free solder structure disclosed in related application Ser. No. 10/246,282, and the PCB fillet is eutectic SnAgCu (SAC) solder common in the industry.

It will be apparent to those skilled in the art that the additions of small amounts of a third, or even a fourth element, to the disclosed Sn/Ag and Sn/Cu off-eutectic alloys would not effect the hierarchy structure and such additions are therefore within the scope of the disclosed invention. The elements added would have to readily form an inter-metallic compound with Sn as does Cu and Ag. Examples of such elements include Bi, Sb, In, Zn and Pd. The addition of approximately 0.5 weight % Sb or 0.5 weight % Bi is a preferred candidate to counter the problem of Sn "whiskers" in relatively pure Sn alloys.

The present invention is an improvement over the prior art. It restricts the amount of liquid in the C4 interconnection during second level reflows, thereby reducing the hydrostatic tensile forces exerted on the encapsulant. It therefore preserves the integrity of the encapsulated C4 structure and prevents delamination and electrical fails due to shorting.

An additional advantage of the present invention is that for chip on board applications, a small amount of eutectic Sn/Ag, Sn/Cu or Sn/Ag/Cu could be used, so that the chip join reflow cycle can be maintained with a peak reflow temperature of 250° C. or less. This would be applicable to the high temp/low temp Pb-free C4 solution for direct chip on organic package situations.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. A method for creating a lead free solder melting hierarchy for first level assembly comprising the steps of;
   providing an electronic circuit chip having ball limiting metallurgy pads on a bottom surface of said chip;
   placing off-eutectic lead free solder on said ball limiting metallurgy pads;
   heating said off-eutectic lead free solder to reflow said off-eutectic lead free solder and form off-eutectic lead free solder bumps on said ball limiting metallurgy pads;
   providing a chip carrier having electrical contact pads on a top surface of said chip carrier;
   placing a lead free solder alloy in contact with said contact pads;
   placing said off-eutectic lead free solder bumps in contact with said lead free solder alloy; and
   heating said off-eutectic lead free solder bumps to reflow said off-eutectic lead free solder bumps to form off-eutectic lead free solder fillets which adhere said chip to said chip carrier.

2. The method of claim 1 further comprising the step of dispensing an encapsulant in the interface between said chip and said chip carrier.

3. The method of claim 1 wherein said off-eutectic solder fillet has a composition between about 84.0 weight % Sn to 99.3 weight % Sn and between about 16.0 weight % Cu to 0.7 weight % Cu and having inter-metallics with a melting temperature greater than 250° C.

4. The method of claim 3 wherein said off-eutectic solder fillet has a composition of about 93.0 weight % Sn, 7.0 weight % Cu and have dispersed grains of SnCu inter-metallic phase structure.

5. The method of claim 3 wherein said off-eutectic solder fillet has a composition of about 84.0 weight % Sn, 16.0 weight % Cu and have dispersed grains of SnCu inter-metallic phase structure.

6. The method of claim 1 wherein said off-eutectic solder fillet has a composition between about 52.0 weight % Sn to 95.0 weight % Sn and between about 48.0 weight % Ag to 7.0 weight % Ag and having inter-metallics with a melting temperature greater than 250° C.

7. The method of claim 6 wherein said off-eutectic solder fillet has a composition of about 82.0 weight % Sn, 18.0 weight % Ag and have dispersed grains of SnAg inter-metallic phase structure.

8. The method of claim 6 wherein said off-eutectic solder fillet has a composition of about 88.0 weight % Sn, 12.0 weight % Ag and have dispersed grains of SnAg inter-metallic phase structure.

9. The method of claim 6 wherein said off-eutectic solder fillet has a composition of about 72 weight % Sn, 28 weight % Ag and have dispersed grains of SnAg inter-metallic phase structure.

10. The method of claim 6 wherein said off-eutectic solder fillet has a composition of about 52 weight % Sn, 48 weight % Ag and have dispersed grains of SnAg inter-metallic phase structure.

11. The method of claim 3 wherein said off-eutectic solder fillet composition further
    comprises approximately 0.01 weight % Bi to approximately 0.5 weight % Bi and approximately 0.01 weight % Sb to approximately 0.5 weight % Sb.

12. The method of claim 3 wherein said off-eutectic solder fillet composition further
    comprises approximately 0.01 weight % to approximately 0.5 weight % of an element selected from the group consisting of Bi, Sb, In, Zn and Pd.

13. The method of claim 6 wherein said off-eutectic solder fillet composition further
    comprises approximately 0.01 weight % Bi to approximately 0.5 weight % Bi and approximately 0.01 weight % Sb to approximately 0.5 weight % Sb.

14. The method of claim 6 wherein said off-eutectic solder fillet composition further
    comprises approximately 0.01 weight % to approximately 0.5 weight % of an element selected from the group consisting of Bi, Sb, In, Zn and Pd.

* * * * *